(12) United States Patent
Cheruiyot et al.

(10) Patent No.: US 10,644,497 B2
(45) Date of Patent: May 5, 2020

(54) CHARGE PUMP FOR DISTRIBUTED VOLTAGE PASSGATE WITH HIGH VOLTAGE PROTECTION

(71) Applicant: International Business Machines Corporation, Armonk, NY (US)

(72) Inventors: Kennedy K. Cheruiyot, Rochester, MN (US); Paul D. Muench, Poughkeepsie, NY (US); Michael A. Sperling, Poughkeepsie, NY (US); Michael R. Whalen, Staten Island, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 331 days.

(21) Appl. No.: 15/597,196

(22) Filed: May 17, 2017

(65) Prior Publication Data

US 2018/0337669 A1    Nov. 22, 2018

(51) Int. Cl.
    *H02H 7/16*     (2006.01)
    *H02M 3/07*     (2006.01)
    *H03K 19/00*    (2006.01)
    *H03K 17/0814*  (2006.01)
    *H02M 1/32*     (2007.01)

(52) U.S. Cl.
    CPC .............. *H02H 7/16* (2013.01); *H02M 3/07* (2013.01); *H03K 17/08142* (2013.01); *H03K 19/0016* (2013.01); *H02M 1/32* (2013.01); *H03K 2217/0054* (2013.01); *H03K 2217/0081* (2013.01)

(58) Field of Classification Search
    CPC ........ H02H 7/16; H02M 3/07; H03K 19/0016
    See application file for complete search history.

(56) References Cited

U.S. PATENT DOCUMENTS

| | | |
|---|---|---|
| 5,508,660 A | 4/1996 | Gersbach et al. |
| 5,844,840 A | 12/1998 | Le et al. |
| 6,031,392 A | 2/2000 | Yee |
| 6,031,394 A | 2/2000 | Cranford, Jr. et al. |
| 6,181,193 B1 | 1/2001 | Coughlin, Jr. |
| 6,731,155 B2 | 5/2004 | Hakkarainen et al. |
| 6,930,536 B2 | 8/2005 | Nazarian et al. |
| 8,248,282 B2 | 8/2012 | Payne et al. |
| 9,083,231 B2 | 7/2015 | Pan et al. |
| 2002/0084834 A1* | 7/2002 | Nakamura ............ H02M 3/073 327/536 |
| 2012/0153909 A1 | 6/2012 | Bucossi et al. |
| 2015/0061744 A1* | 3/2015 | Bulzacchelli ........... G05F 1/625 327/306 |

* cited by examiner

*Primary Examiner* — Scott Bauer
(74) *Attorney, Agent, or Firm* — Cantor Colburn LLP; Margaret McNamara

(57) ABSTRACT

Embodiments include a technique for using a charge pump for a distributed voltage passgate with high voltage protection. The technique includes receiving a reference signal, and preventing the reference signal from passing through a passgate to a circuit, wherein the passgate is an NFET passgate. The technique also includes charging the passgate using a charge pump circuit above the reference signal, and regulating the charge pump circuit using a clock signal. The technique also includes controlling the passgate based at least in part on the charge pump circuit.

15 Claims, 5 Drawing Sheets

CHARGE PUMP FOR DISTRIBUTED VOLTAGE PASSGATE WITH HIGH VOLTAGE PROTECTION

BACKGROUND

The present invention generally relates to circuits, and more specifically, to using a charge pump for a distributed voltage passgate with high voltage protection.

In today's environment, computing and electronic devices include microprocessors having a plurality of processing cores. These large multi-core chips can independently power each of the processing cores based on the requirements of one or more current tasks. Each core can have different power requirements and can operate in different combinations. An increase in the number of cores of a microprocessor increases the processing capability and also increases the power consumed by the microprocessor to drive each of the processing cores. When a processing core is not needed, the core can be powered off to increase power savings of the multi-core chip.

SUMMARY

Embodiments of the present invention are directed to a method for using a charge pump for a distributed voltage passgate with high voltage protection. A non-limiting example of the method includes receiving a reference signal, and preventing the reference signal from passing through a passgate to a circuit, where the passgate is an NFET passgate. The method also includes charging the passgate using a charge pump circuit above the reference signal, and regulating the charge pump circuit using a clock signal. The method includes controlling the passgate based at least in part on the charge pump circuit.

Embodiments of the present invention are directed to a system for a charge pump for a distributed voltage passgate with high voltage protection. A non-limiting example of the system includes a reference circuit for generating a reference signal to be used by a core of a multiprocessor chip, and a charge pump circuit for generating a voltage to drive the passgate, where the voltage is greater than a voltage of the reference signal. The system also includes a passgate for controlling the transmission of a reference signal to the core of the multiprocessor chip, where the passgate is an NFET passgate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
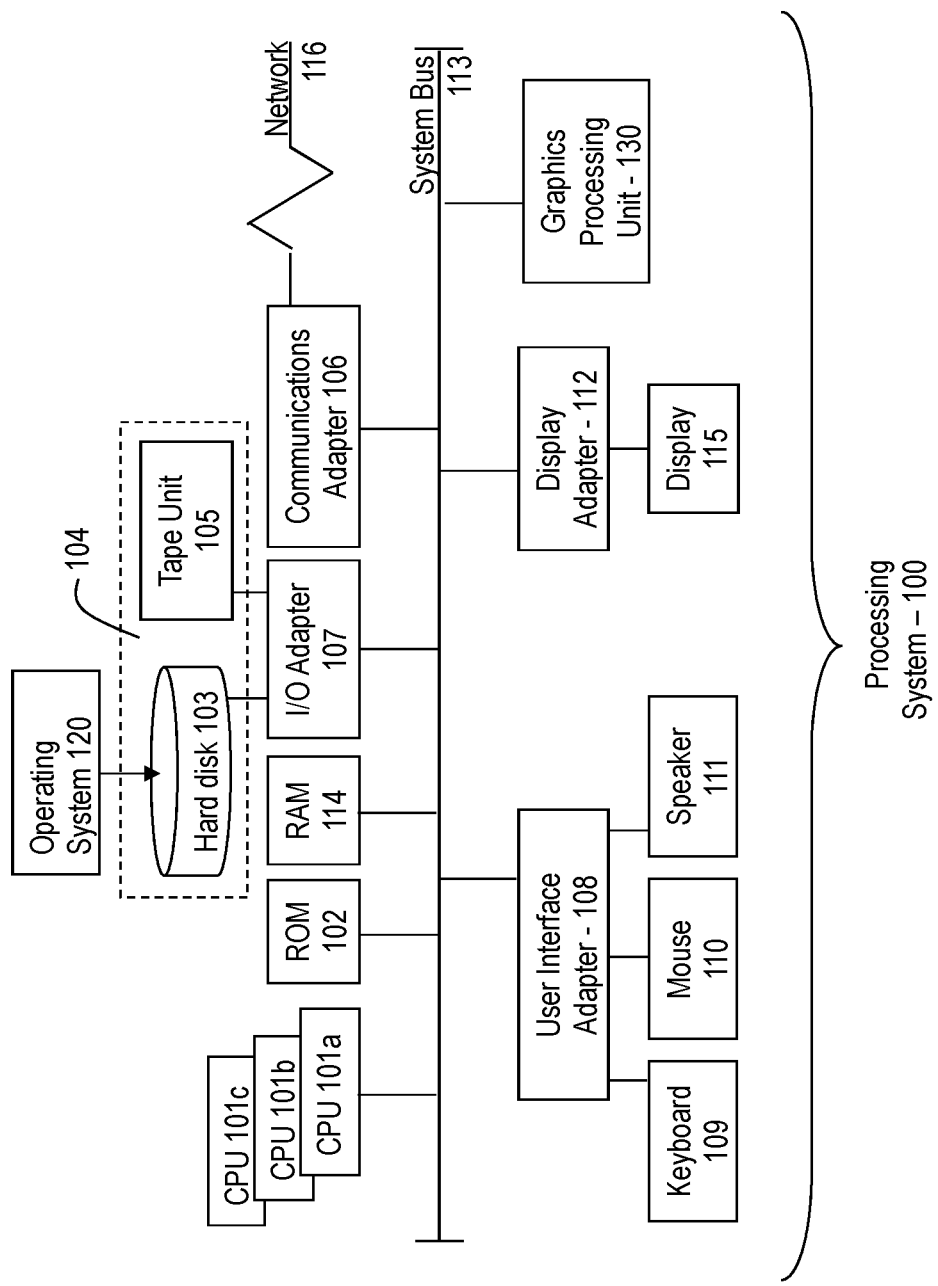
FIG. 1 depicts a block diagram illustrating one example of a processing system for practice of the teachings herein.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e.

two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

A transmission gate is an electronic component that can selectively block or pass a signal from an input to an output. Transmission gates include p-channel field-effect transistors (PFETs) and n-channel field-effect transistors (NFETs) for selection. One application of transmission gates is used to control a signal entering the cores of the multi-core processor. The transmission gate can be used to selectively block or pass the signal into the processing core for processing, clocks, power supplies, and the like.

In a scenario when a processing core is powered OFF, a "sneak" path can be formed which allows a reference signal to pass through the transmission gate which can result in pulling down a reference signal voltage that is shared among several processing cores. In conventional transmission gates, a sneak path can exist through the PFET side of the transmission gate of a processing core that is in the OFF state impacting the reference voltage required by the processing cores that are in the ON state.

Turning now to an overview of the aspects of the invention, one or more embodiments of the invention address the above-described shortcomings of the prior art by providing a charge pump used for an NFET passgate to prevent reference signal leakage into a processing core that is powered OFF. The PFET used in the conventional transmission gates allow for leakage through the transistor during the OFF state. An NFET passgate is used to reduce the probability that a formation of a sneak path will be formed.

NFETs require a higher voltage to be switched ON. The techniques described herein makes use of an NFET passgate and a charge pump circuit to generate the high voltage necessary to turn ON the NFET passgate to control the passing of reference signal into a processing core. In one or more embodiments, the voltage is set to be equal to a power supply voltage (VDD) plus one NFET overdrive voltage.

Charge pumps convert and regulate voltages using switching technology and capacitive-energy storage elements. The charge pumps generally include a plurality of capacitors to increase the voltage in a circuit, which allows the circuit to drive higher voltage loads. In one or more embodiments, a charge pump is used to increase the voltage high enough to switch the NFET passgate into a passing state.

The above-described aspects of the invention address the shortcomings of the prior art by substituting the PFET/NFET transmission gate with an NFET passgate to eliminate the potential for generating sneak paths to a circuit when the core is powered OFF. The circuit uses an NFET to ensure there is no signal being transmitted into a core when the processing core is powered OFF.

Conventional techniques makes use of transmission gates that include both PFETs and NFETs to control the passage of the reference signal to a circuit of a processing core, where the PFET of the transmission gate is vulnerable to sneak paths when the processing core is powered OFF. The sneak paths can attenuate the reference signal which can be shared among a plurality of processing cores. A processing core that is powered OFF can potentially pull down the reference signal of the multi-core circuit.

One or more aspects of the invention, prevents the formation of a sneak path through a core of a multi-core processor, thereby preserving the degradation of the reference signal. One or more aspects of the invention increases the integrity of a reference signal that is shared and received by the processing cores of a multi-core processor.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1.

Figure 2:
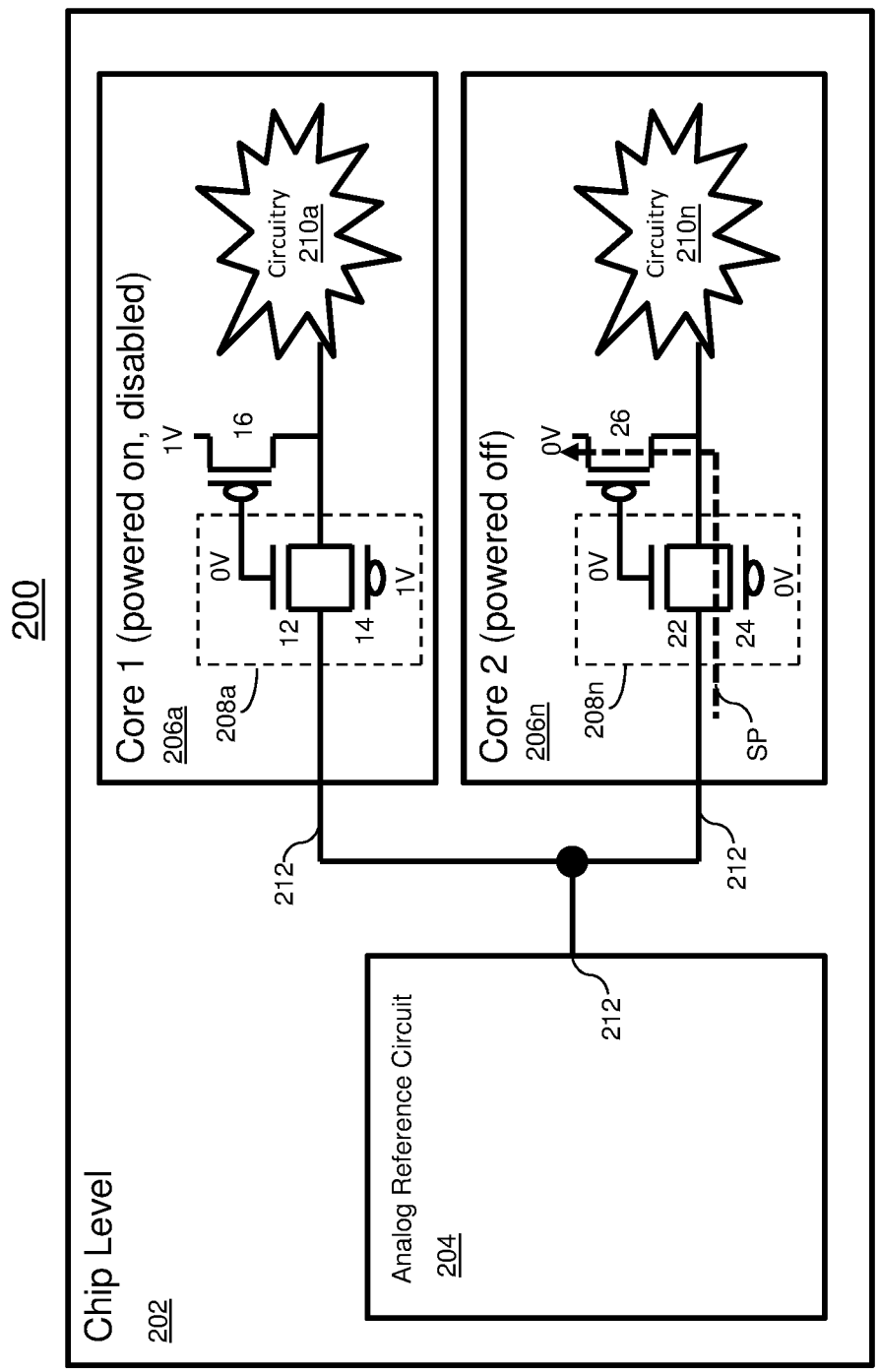
FIG. 2 depicts a circuit implementing a transmission gate.

Now referring to FIG. 2, a chip level circuit 200 providing a NFET/PFET transmission gate 208 is shown. The circuit 200 includes the chip level 202 which further includes an analog reference circuit 204 and one or more cores 206. The reference circuit 204 is used to produce a fixed voltage. The reference signals can be used for various applications including power supplies, A/D conversion, D/A conversion, and measurement and control systems. The circuit 200 can include one or more processing cores. In an example, FIG. 2 includes two processing cores 206a, 206n.

The NFET of the transmission gate 208a has 0V applied to its gate powering the NFET OFF while the PFET has 1V applied to its gate powering the PFET OFF.

The processing core 206a provides a scenario where the transmission gate 208a of the core 206a is powered ON and the transmission gate 208a is disabled. The gate voltages of the transistors of the transmission gate 208a determines whether a reference signal 212 from the analog reference circuit 204 is allowed to pass through to a circuitry 210a of the core 206a. For example, as shown in core 206a, the gate voltage of the NFET 12 is 0V and the gate voltage of the PFET 14 is 1V. This configuration disables the reference signal 212 from passing to the circuit 210a. In one or more embodiments, the gate voltages can be controlled by another circuit and/or control signal. Also, the core 206a as shown provides a 1V signal that is applied to the PFET 16 to prevent the signal at the circuit 210a from floating.

The processing core 206n is in the powered OFF state. The NFET 22 in the transmission gate 208n has 0V applied to its gate similar to the PFET 24. The PFET 24 can allow a signal to pass through the transmission gate and on to the circuit 210n given the PFET 26 is in the ON state when a 0V is applied to its gate. This scenario can generate a sneak path SP which has the effect of pulling down the signal 212. This path is referred to as a sneak path SP. Although the processing core 206n is powered OFF, the reference signal 212 passes through the sneak path SP into the circuit 210n.

Figure 3:
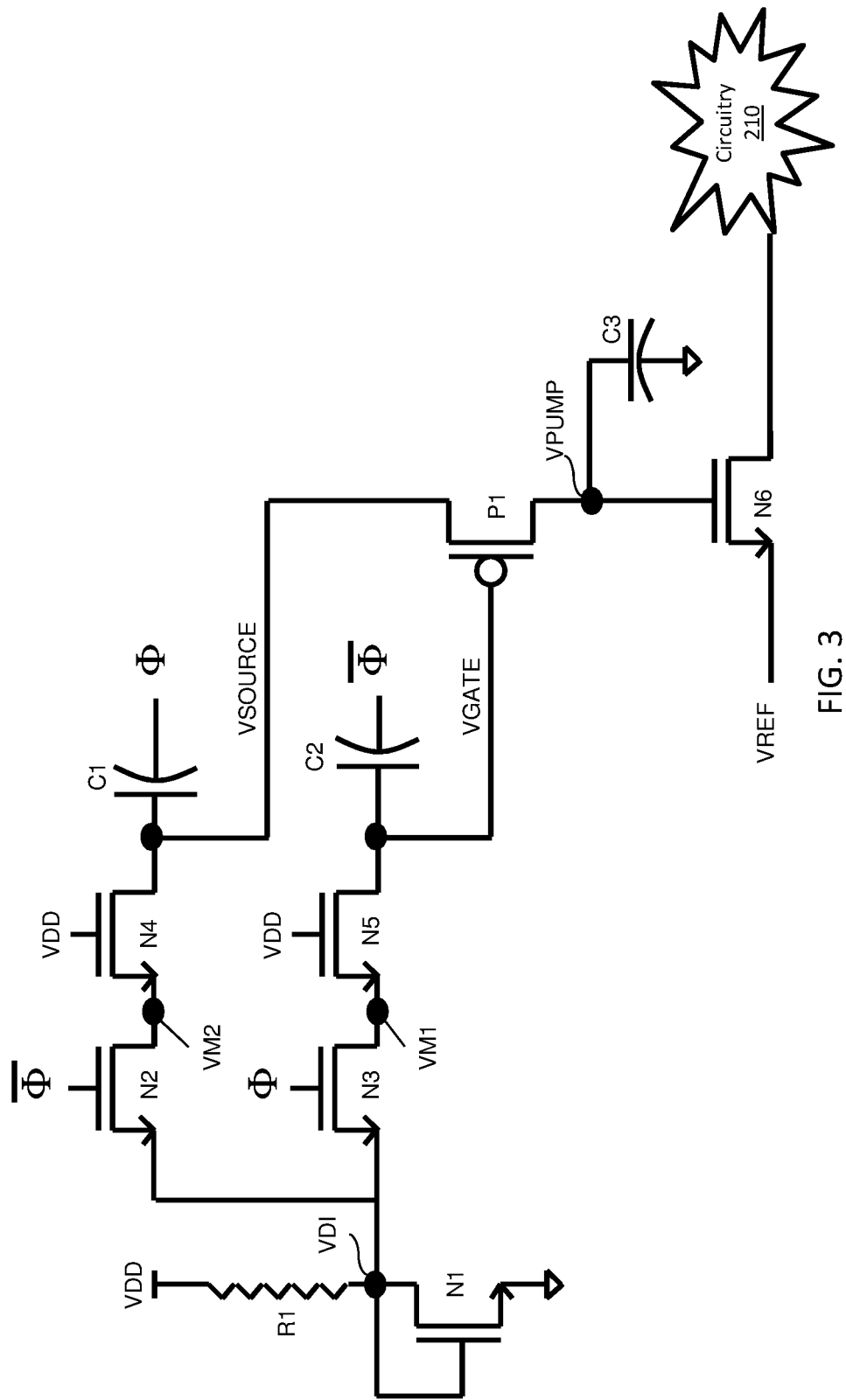
FIG. 3 depicts a circuit for a charge pump for a distributed voltage passgate with high voltage protection in accordance with an embodiment.

Now referring to FIG. 3 with continued reference to FIG. 2, a circuit 300 for a charge pump for distributed voltage passgate with high voltage protection in accordance with an embodiment is shown.

In one or more embodiments, the transmission gate 208 of cores 206a and 206n can be replaced in the chip 202 with the passgate N6 and charge pump circuit of FIG. 3. The NFET will prevent a sneak path from forming and pulling down the generated reference signal 212. In addition, a charge pump circuit is used to ensure the passgate N6 is capable of transmitting the reference signal 212. In one or more embodiments, the transistors of the charge pump circuit are thin oxide devices, where the voltage differential between any of the components are less than 1V to prevent each transistor from being damaged.

As shown in FIG. 3, the resistor R1 and transistor N1 are configured to provide a voltage VDI (diode connected voltage, also referred to as a passgate threshold voltage) for the circuit 300. The circuit 300 is connected to a power supply VDD and ground. As a non-limiting example, the power supply VDD is a 1V source. In one or more embodiments, the voltage VDI is configured to be approximately at least one NFET threshold voltage VT. As a non-limiting example, the threshold voltages VT can range from 250-300 mV.

The transistor N6 determines whether the reference signal 212 is allowed to pass through to a circuit 210a that is coupled to the passgate 208a. In one embodiment, an NFET passgate transistor N6 is used to completely disable a signal from passing or leaking through when the NFET N6 is powered OFF, in contrast to using a PFET as the passgate transistor which can allow a signal to pass through when the PFET is thought to be OFF. Specifically, when a PFET has 0V applied to its gate a signal is allowed to pass through to the circuit 210 because the PFET is switched ON.

In FIG. 3 as shown, the clock ϕ and not clock signals $\overline{\phi}$ are powered by the power supply VDD. The clocks are used in combination with the capacitors to make the voltage VGATE and the voltage VSOURCE signals toggle between NFET threshold voltage (VDI) and NFET threshold voltage plus the power supply voltage (VDI+VDD) when powered ON. In one or more embodiments, the first clock signal and the second not clock signal are complementary to each other. In a different example, non-overlapping clock signals can be used in the circuit.

The transistors N4, N5 function as protection devices protecting the N2, N3 transistors from exceeding a voltage equal to the power supply VDD voltage. When the power supply VDD is ON, the transistors N2, N3 are protected from the VGATE/VSOURCE high voltages by not allowing the points VM1, VM2 to rise above the power supply VDD voltage. Without the protection transistors N4, N5 (also referred to as high voltage protection transistors), the transistors N2, N3 would be exposed to the high voltages of VGATE/VSOURCE damaging the transistors and ultimately damaging the charge pump circuit.

When the circuit is powered ON, the charge pump is activated to operate the passgate N6 to allow the reference signal VREF to pass through passgate N6 and pass signal VPASS to the circuit 210. As the clock used to generate the clock signals are powered ON, the passgate transistor P1 switches ON and OFF allowing the signal VSOURCE to connect to the gate of the passgate transistor N6. The voltage VPUMP applied to the gate of the passgate transistor N6 is sufficiently high enough to pass the reference signal VREF through. The capacitor C3 is coupled to the circuit to hold the voltage VPUMP as the clock signals are switched. The capacitors C1 and C2 are utilized to boost the threshold voltage VDI to assist in generating the voltage VPUMP.

When the circuit 300 is powered OFF, the charge pump circuit will be drained which turns passgate transistor N6 OFF. When the passgate transistor N6 is OFF, the reference signal VREF cannot pass through or sneak through to the circuit 210.

Figure 4:
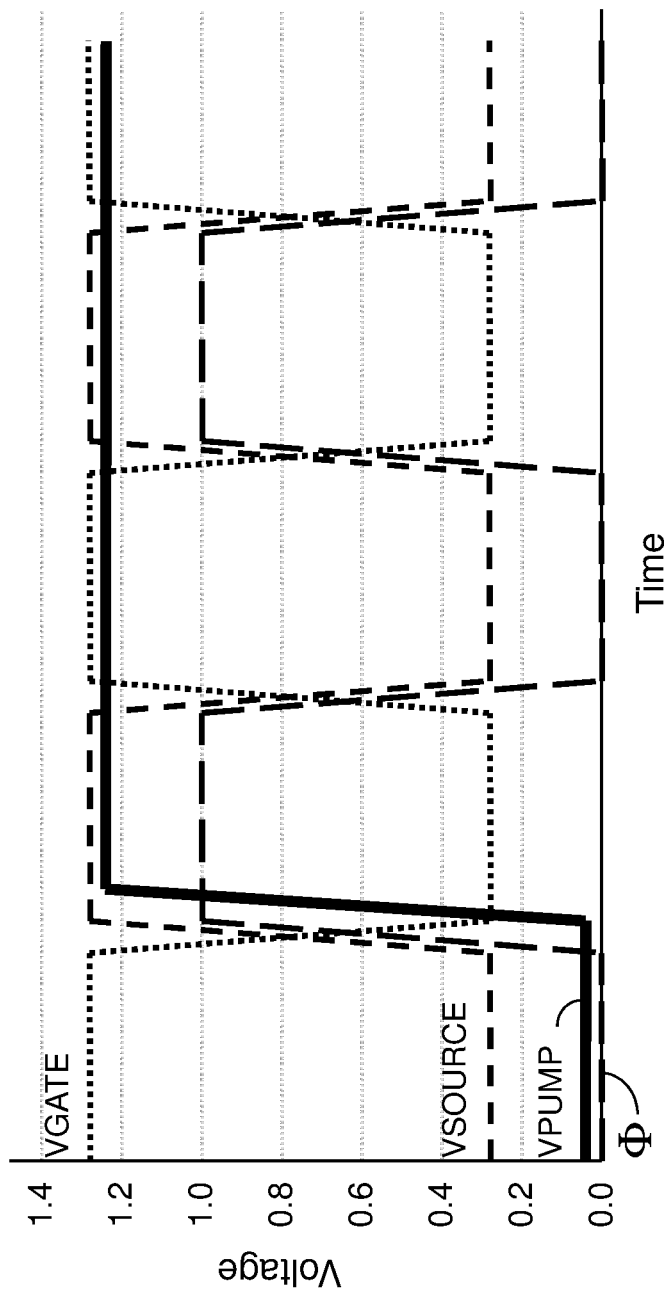
FIG. 4 depicts a waveform for a charge pump for a distributed voltage passgate with high voltage protection in accordance with an embodiment.

Now referring to FIG. 4, a waveform 400 for operating a charge pump for a distributed voltage passgate with high voltage protection is shown. The waveform 400 provides the response for the voltage of the clock, VGATE, VSOURCE, and VPUMP of FIG. 3.

The clock signal as shown oscillates between 0-1V during each clock cycle, where the clock is powered by the power supply VDD. The voltage VGATE is driven opposite of the voltage VSOURCE during the clock cycle. The voltage VPUMP remains at a low signal during the first cycle, however after the capacitors in the charge pump circuit are charged, the voltage VPUMP is maintained at approximately VDD+VDI. The capacitors maintain the voltage VPUMP at this level as the clock oscillates. When power VDD is removed from the charge pump circuit, the voltage VPUMP is drained and turns OFF the NFET of the passgate and disables any signal leakage or sneak path through the passgate.

In this sample waveform 400, the second clock signal is not shown in the waveform. In an example, the second clock signal is opposite to that of the first clock signal. In a different example, the second clock signal is a non-overlapping clock signal.

Figure 5:
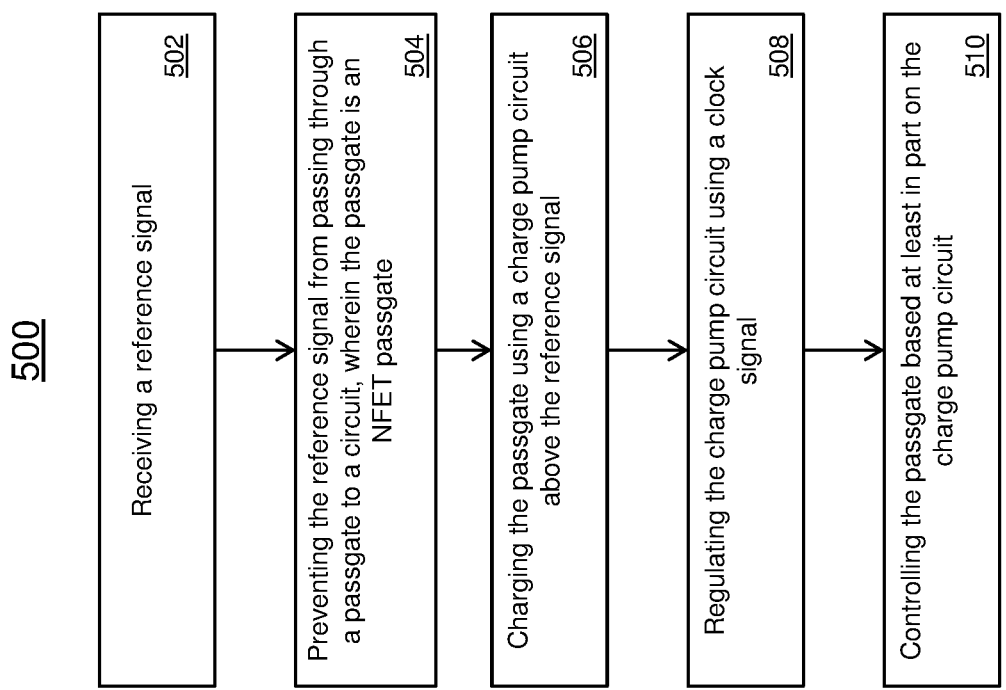
FIG. 5 depicts a method for implementing a charge pump for a distributed voltage passgate with high voltage protection in accordance with an embodiment.

Now referring to FIG. 5 with continued reference to FIG. 3, a method 500 for implementing a charge pump for distributed voltage passgate with high voltage protection in accordance with an embodiment is shown. Block 502 provides receiving a reference signal. In one or more embodiments, the reference signal is an analog signal that is generated by an analog reference circuit and provided to each processing core of a multi-core processor during operation. In one or more embodiments, the reference signal VREF can be received at a processing core passgate transistor N6 as depicted in FIG. 3. A reference signal can be shared among a plurality of processing cores of a memory chip.

Block 504 provides preventing the reference signal from passing through a passgate to a circuit, wherein the passgate is an NFET passgate. When the NFET N6 is powered OFF the reference signal VREF is not allowed to pass through NFET N6 and onto a connected circuit 210.

Block 506 provides charging the passgate using a charge pump circuit above the reference signal. In one or more embodiments, the charge pump is used to raise the voltage provided to the gate of the passgate above the voltage of the reference signal provided to the passgate. In one or more embodiments, the gate voltage of the passgate exceeds the voltage of the power supply of the circuit by an NFET threshold voltage. As a non-limiting example, the NFET threshold voltage can be between 100 mV to 300 mV.

Block 508 provides regulating the charge pump circuit using a clock signal. As shown in FIG. 3, the clock signals drive the voltage VGATE and the voltage VSOURCE of the transistor P1 which is coupled to the gate of the passgate transistor. In one or more embodiments, the first clock signal and the second clock signal are opposites of one another. In a different embodiment, the two clock signals are non-overlapping clock signals.

Block 510 provides controlling the passgate based at least in part on the charge pump circuit. In one or more embodiments, when the charge pump is powered ON, the voltage provided to the gate of the passgate switches the passgate transistor ON and allows the reference signal to pass through to the circuit. When the charge pump is powered OFF, the gate voltage of the passgate is drained and turns the passgate transistor OFF. When the passgate is OFF, the reference signal is unable to pass through to the circuit and a sneak path cannot be formed.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for using a charge pump for a distributed voltage passgate with high voltage protection, the method comprising:
   receiving a reference signal;
   preventing the reference signal from passing through a passgate to a circuit, wherein the passgate is an n-channel field-effect transistor (NFET) passgate;
   charging the passgate using a charge pump circuit above the reference signal, wherein the charge pump comprises a first transistor connected to a first high voltage protection transistor and a second transistor connected to a second high voltage protection transistor;
   regulating the charge pump circuit using a clock signal;
   controlling the passgate based at least in part on the charge pump circuit; and
   protecting the charge pump circuit using first and second high voltage protection transistors, wherein the first high voltage protection transistor is positioned between the first transistor and a first capacitor of the charge pump, wherein the second high voltage protection transistor is positioned between the second transistor and a second capacitor of the charge pump.

2. The method of claim 1, further comprising powering on the charge pump circuit to activate the passgate.

3. The method of claim 1, further comprising powering off the charge pump circuit to drain the charge pump circuit down to zero volts and turning off the passgate.

4. The method of claim 1, wherein the clock signal used by the charge pump circuit comprises a first signal and a second clock signal.

5. The method of claim 4, wherein the first clock signal is opposite the second clock signal.

6. The method of claim 4, wherein the first clock signal and the second clock signal are non-overlapping signals.

7. The method of claim 1, further comprising holding a voltage of the passgate when the charge pump circuit is on.

8. A system using a charge pump for a distributed voltage passgate with high voltage protection, the system comprising:
   a reference circuit for generating a reference signal to be used by a core of a multiprocessor chip;
   a charge pump circuit operable to generate a voltage to drive the passgate, wherein the voltage is greater than a voltage of the reference signal, wherein the charge pump circuit comprises a first transistor connected to a first high voltage protection transistor and a second transistor connected to a second high voltage protection transistor, wherein the first high voltage protection transistor is positioned between the first transistor and a first capacitor of the charge pump, wherein the second high voltage protection transistor is positioned between the second transistor and a second capacitor of the charge pump; and
   a passgate operable to control transmission of a reference signal to the core of the multiprocessor chip, wherein the passgate is an n-channel field-effect transistor (NFET) passgate.

9. The system of claim 8, wherein the charge pump circuit uses a capacitor to maintain a voltage of the charge pump circuit for the passgate.

10. The system of claim 8, wherein the reference signal is an analog signal.

11. The system of claim 8, wherein the charge pump circuit includes a power supply voltage equal to 1000 mV.

12. The system of claim 8, wherein a passgate threshold voltage is 300 mV.

13. The system of claim 8, wherein a first clock signal and a second clock signal of the charge pump circuit are non-overlapping clock signals.

14. The system of claim 8, wherein the passgate resides on each core of a multi-core processor.

15. The system of claim 13, wherein a gate voltage of the passgate and a source voltage of the passgate toggles between an NFET threshold voltage and a NFET threshold voltage plus a power supply voltage based on the clock.

\* \* \* \* \*